(12) United States Patent
Kumar

(10) Patent No.: US 11,696,406 B2
(45) Date of Patent: Jul. 4, 2023

(54) AUTOMATIC TRIMMING OF A PCB-BASED LC CIRCUIT

(71) Applicant: Microchip Technology Incorporated, Chandler, AZ (US)

(72) Inventor: Ajay Kumar, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 92 days.

(21) Appl. No.: 17/492,354

(22) Filed: Oct. 1, 2021

(65) Prior Publication Data
US 2022/0369461 A1 Nov. 17, 2022

Related U.S. Application Data

(60) Provisional application No. 63/181,635, filed on Apr. 29, 2021.

(51) Int. Cl.
| | |
|---|---|
| H05K 1/16 | (2006.01) |
| H05K 3/22 | (2006.01) |
| H01F 38/14 | (2006.01) |

(52) U.S. Cl.
CPC ............ *H05K 1/162* (2013.01); *H01F 38/14* (2013.01); *H05K 1/165* (2013.01); *H05K 3/225* (2013.01); *H01F 2038/146* (2013.01); *H05K 2201/10151* (2013.01)

(58) Field of Classification Search
CPC ... H05K 2203/171; H05K 1/162; H05K 3/225
See application file for complete search history.

(56) References Cited

U.S. PATENT DOCUMENTS

| | | | |
|---|---|---|---|
| 2014/0049273 A1 | 2/2014 | Rocznik | 324/679 |
| 2015/0008985 A1 | 1/2015 | Kuramochi | 331/25 |
| 2020/0373923 A1 | 11/2020 | Walsh et al. | |

FOREIGN PATENT DOCUMENTS

GB   2120478 A   11/1983   ............... H03J 3/18

OTHER PUBLICATIONS

Hong, Yunseog et al., "A Label-Free Biosensing Platform Using a PLL Circuit and Biotin-Streptavidin Binding System," IEEE Transactions on Biomedical Circuits and Systems, vol. 9, No. 3, pp. 345-352, Jun. 1, 2015.
International Search Report and Written Opinion, Application No. PCT/US2021/057206, 11 pages, dated Feb. 18, 2022.

*Primary Examiner* — Jeremy C Norris
(74) *Attorney, Agent, or Firm* — Slayden Grubert Beard PLLC

(57) ABSTRACT

Apparatus and methods of automatically trimming a PCB-based LC circuit. The apparatus may comprise an interface to a printed circuit board (PCB). The PCB may include a PCB inductor and a PCB capacitor to form an LC circuit. The LC circuit may have an LC circuit frequency. The apparatus may comprise a variable capacitor communicatively coupled to the interface and configured to adjust an effective capacitance of the LC circuit.

19 Claims, 3 Drawing Sheets

AUTOMATIC TRIMMING OF A PCB-BASED LC CIRCUIT

PRIORITY

The present application claims priority to U.S. Provisional Patent Application No. 63/181,635 filed Apr. 29, 2021, the contents of which are hereby incorporated in their entirety.

FIELD OF THE INVENTION

The present disclosure relates to electronics and, more particularly, to automatic trimming of a PCB-based LC circuit.

BACKGROUND

Touch and proximity systems may use sensors that measure inductance or mutual inductance in order to determine whether objects have touched or are proximate to the sensors. The inductance generated by sensors, or a change in such inductance, may be a measure of the proximity or a foreign object, such as a finger, stylus, or other body.

The inductance of these sensors may be caused by inductors, and associated circuits that include such inductors. These may include inductor-capacitor (LC) and resistor-inductor-capacitor (RLC) circuits. These circuits may generate sinusoidal signals associated with their tank frequency for detections, or measurements. Changes in the value of coupling to the secondary coil or coils can be used to detect where the target is or rate at which the target is moving.

Inductive positioning sensor may be implemented in part by components soldered onto printed circuit boards (PCBs). As such, the capacitors of the inductive positioning sensor system may be soldered onto the PCBs. Moreover, inductors may be formed within layers on top of or inside the PCB itself. The frequency of the LC or RLC circuits formed by these inductors and capacitors may be established according to the capacitance, inductance, impedance, and resistance values of these components and the layout of such components.

Inventors of examples of the present disclosure have discovered that the variations causing in manufacturing of PCBs and of inductors on the PCBs may cause variations in the frequency of the resultant LC and RLC circuits of the touch sensors. Moreover, inventors of examples of the present disclosure have discovered that surface-mount capacitors that are soldered to PCBs may have to be soldered and de-soldered more than once to account for these variations in manufacturing and still maintain a relatively narrow band for tank oscillation frequency of the resultant LC and RLC circuits. In production, such surface-mount capacitors are often themselves insufficiently accurate. Moreover, changing the frequency of the resultant LC and RLC circuits of the inductive positioning sensors may include de-soldering and removing one surface-mount capacitor and replacing it with another surface-mount capacitor that is to be soldered again to the PCB. These approaches have been found to be time-consuming, imprecise, and not very cost effective. In addition, inductors with high tolerances have been found to be very expensive to form on PCBs. Examples of the present disclosure may address one or more of these discoveries by the inventors.

SUMMARY

The present disclosure provides an apparatus to automatically trim a PCB-based LC circuit. The apparatus may comprise an interface to a printed circuit board (PCB). The PCB may include a PCB inductor and a PCB capacitor to form an LC circuit. The LC circuit may have an LC circuit frequency. The apparatus may comprise a variable capacitor communicatively coupled to the interface and configured to adjust an effective capacitance of the LC circuit. The apparatus may further comprise an adjustment circuit configured to adjust a capacitance of the variable capacitor to change the LC circuit frequency according to a reference frequency. The variable capacitor may be connected in parallel to the PCB capacitor through the interface. The adjustment circuit may be further configured to increase the capacitance of the variable capacitor to increase the effective capacitance of the LC circuit to decrease the LC circuit frequency. The adjustment circuit may be further configured to decrease the capacitance of the variable capacitor to decrease the effective capacitance of the LC circuit to increase the LC circuit frequency. The adjustment circuit may include a frequency comparator circuit configured to compare the LC circuit frequency against a reference frequency, wherein the adjustment circuit is further configured to adjust the capacitance of the variable capacitor based upon the comparison of the LC circuit frequency and the reference frequency. The adjustment circuit may further include an up/down counter configured to increase or decrease a quantification of an adjustment for the capacitance of the variable capacitor based upon the comparison of the LC circuit frequency and the reference frequency. The variable capacitor may be configured to adjust the effective capacitance of the LC circuit based upon the quantification of the up/down counter.

One aspect provides a method of trimming the capacitance of a printed circuit board (PCB) where the PCB includes a PCB inductor and a PCB capacitor to form an LC circuit and the LC circuit has an LC circuit frequency. The method comprises coupling a variable capacitor to, and in parallel with, a fixed capacitor wherein the variable capacitor is incorporated into an integrated circuit mounted to a PCB and the fixed capacitor is mounted to the PCB as part of an LC circuit, comparing an LC circuit frequency of the LC circuit with a reference frequency, increasing a capacitance of a variable capacitor if the LC circuit frequency is higher than the reference frequency, and decreasing the capacitance of the variable capacitor if the LC circuit frequency is lower than the reference frequency. The method may further comprise incrementing a counter if the LC circuit frequency is higher than the reference frequency, decrementing the counter if the LC circuit frequency is lower than the reference frequency, and setting the capacitance of the variable capacitor based on the value of the counter. In some examples, the method may terminate after both increasing and decreasing the capacitance. In other examples, the method ma terminate after a predetermined amount of time has elapsed. In some examples, the method may further comprise determining an initial capacitance of the variable capacitor, loading the counter with a value corresponding to the initial capacitance, and setting the capacitance of the variable capacitor based on the value of the counter. In some examples, the variable capacitor may comprise two terminals and a plurality of capacitor units, each capacitor unit selectively coupled to the terminals, wherein setting the capacitance of the variable capacitor further comprises selectively coupling a number of capacitor units equal to the value of the counter.

Another aspect provides a microcontroller configured to trim a capacitance of a printed circuit board (PCB), the PCB including a PCB inductor and a PCB capacitor to form an LC circuit, the LC circuit having an LC circuit frequency.

The microcontroller may comprise a variable capacitor coupled to, and in parallel with, a fixed capacitor wherein the variable capacitor is incorporated into a microcontroller mounted to a PCB and the fixed capacitor is mounted to the PCB as part of an LC circuit. The microcontroller may be programmed to compare an LC circuit frequency of the LC circuit with a reference frequency, increase a capacitance of a variable capacitor if the LC circuit frequency is higher than the reference frequency, and decrease the capacitance of the variable capacitor if the LC circuit frequency is lower than the reference frequency. In some examples, the microcontroller may be further programmed to increment a counter if the LC circuit frequency is higher than the reference frequency, decrement the counter if the LC circuit frequency is lower than the reference frequency, and set the capacitance of the variable capacitor based on the value of the counter. In some examples, the microcontroller may be further programmed to terminate the method after both increasing and decreasing the capacitance. In some examples, the microcontroller may be further programmed to terminate the method after a predetermined amount of time has elapsed. In some examples, the microcontroller may be further programmed to determine an initial capacitance of the variable capacitor, load the counter with a value corresponding to the initial capacitance, and set the capacitance of the variable capacitor based on the value of the counter.

BRIEF DESCRIPTION OF THE DRAWINGS

Example aspects of the present disclosure are described below in conjunction with the figures, in which.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
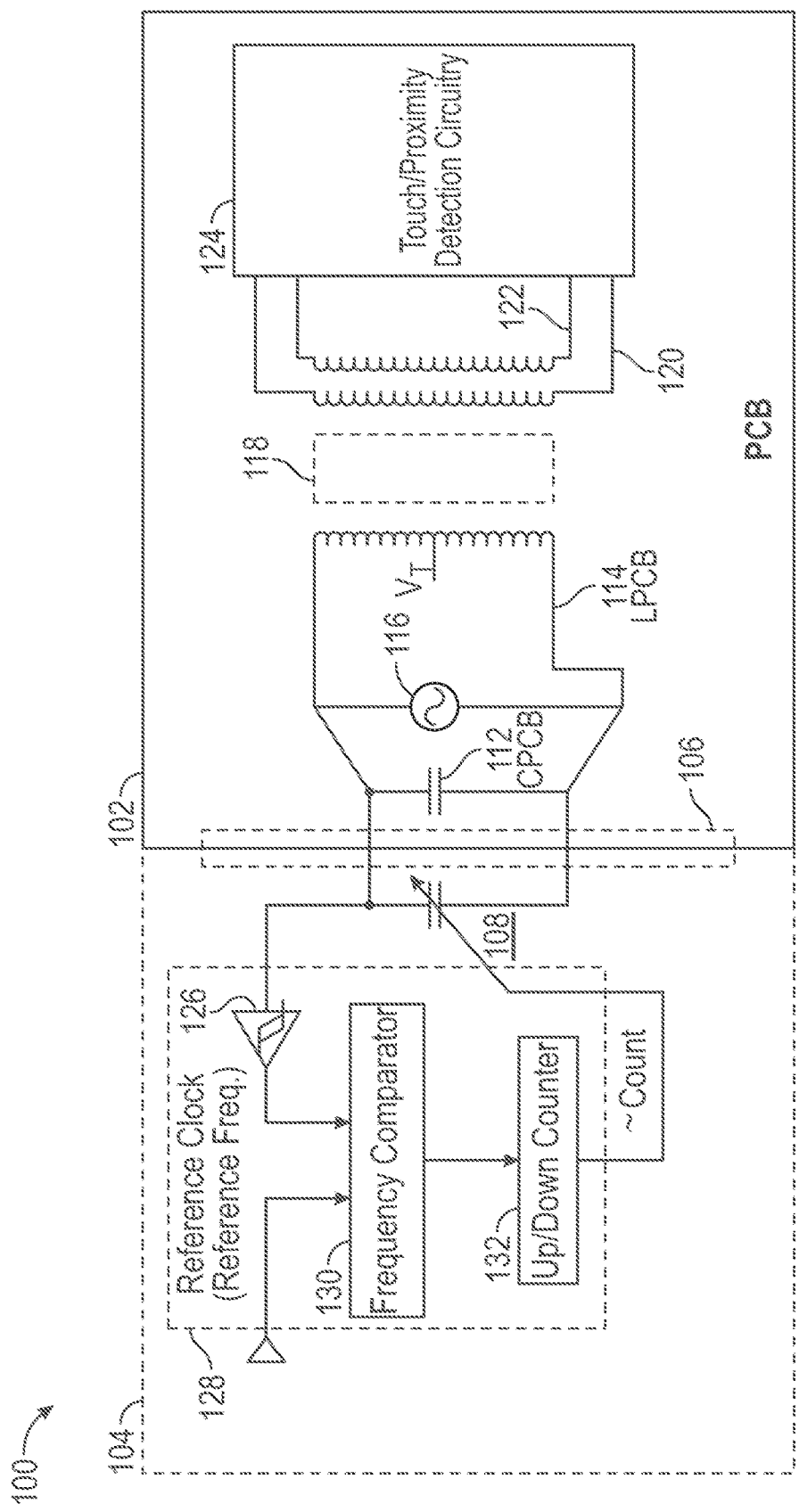
FIG. 1 is a circuit diagram of an example system for automatically trimming a PCB-based LC circuit.

FIG. 1 is an illustration of an example system 100 for automatic trimming of a PCB-based LC circuit, according to embodiments of the present disclosure. System 100 may implement, fully or in part, an inductive positioning sensing system. Moreover, system 100 may implement an inductive positioning sensing system that is implemented fully or in part on a PCB. In addition, system 100 may implement, fully or in part, any suitable system that includes LC or RLC circuits implemented on a PCB. In the present disclosure, LC circuits may be referenced specifically, but the teachings of the present disclosure may also be suitably applied to RLC circuit.

System 100 may include a PCB 102. PCB 102 may include an inductive positioning sensor system. PCB 102 may include an LC circuit. The LC circuit may include a base frequency or resonant frequency. This may be referred to as the LC frequency. System 100 may include an automatic calibration circuit 104. Automatic calibration circuit 104 may be configured to adjust the LC frequency of the LC circuit of PCB 102. Automatic calibration circuit 104 and PCB 102 may be communicatively coupled via the on-chip driver circuit for LC tank 106. The on-chip driver circuit 106 may be implemented in any suitable manner, such as differential pair, diff-pair with negative $g_m$, or other form of LC-tank driver circuit. Automatic calibration circuit 104 may be implemented in, for example, a chip, die, processor, application specific integrated circuit, or PCB separate from PCB 102.

Automatic calibration circuit 104 may be configured to adjust the LC frequency based upon any suitable criteria. For example, automatic calibration circuit 104 may be configured to adjust the LC frequency upon start-up, periodically, on-demand, based upon user input, or based upon settings stored in, for example, registers or fuses. Adjustment of the LC frequency may be performed when a target is not expected to be close to or touching the inductive positioning sensing system of PCB 102.

PCB 102 may include an inductor, denoted as $L_{PCB}$ 114. Moreover, PCB 102 may include a capacitor, denoted as $C_{PCB}$ 112. These may be connected together in parallel. Moreover, PCB 102 may include any other suitable components such as one or multiple secondary coil inductors such as inductors 120, 122, and inductive positioning detection circuitry 124. The position of a foreign body, such as by target 118, may be detected by $L_{PCB}$ 114 in combination with a coupled signal from sense coils 120 and 122. The coils 120 and 122 may form a sine and cosine form of coupling of primary coil to secondary coil. The arctangent of the ratio of the sine and cosine signals may represent the position angle "theta". The resultant arctangent may take any suitable form to indicate the proximity or touch of target 118.

The capacitance of $C_{PCB}$ 112 may be set so as to generally approximate a desired LC frequency for PCB 102. However, as discussed above, manufacturing tolerances of inductor 114 may cause an incorrect or wide variation on LC frequency for the given capacitance of $C_{PCB}$ 112, which can pose an electromagnetic interference issue to other nearby electronic equipment or systems. Accordingly, automatic calibration circuit 104 may be configured to adjust the LC frequency of PCB 102, as discussed above. More specifically, automatic calibration circuit 104 may be configured to adjust the LC frequency of PCB 102 by changing an effective capacitance of the LC circuits of PCB 102. For example, automatic calibration circuit 104 may be configured to adjust the effective capacitance of the LC circuits of PCB 102 by adding or subtracting additional capacitance in parallel with $C_{PCB}$ 112. In one example, such additional capacitance may adjust the effective capacitance $C_{PCB}$ 112 within the context of the LC circuit including $C_{PCB}$ 112, and thus the LC frequency of PCB 102. The adding or subtracting of capacitance in parallel with $C_{PCB}$ to adjust the effective capacitance may be referred to as the trimming of effective capacitance of the LC circuit.

Inductors of PCB 102, such as $L_{PCB}$ 114, may have an inductance within the range of 3-12 µH. The capacitance of capacitor $C_{PCB}$ 112 may have a range of 0.1-5 nF. The LC frequency of the LC circuit of $L_{PCB}$ 114 and $C_{PCB}$ 112 may have a range of 1-6 MHz The LC frequency of the LC circuit may be expressed as $$f = \frac{1}{2\pi\sqrt{LPCB * CPCB}}$$

It may be desired that the actual frequency of the LC circuit be within +/−5% of a target frequency. Accordingly, automatic calibration circuit 104 may be configured to compare the actual LC frequency of PCB 102 with a reference frequency, and to adjust the capacitance to be applied to the LC circuit accordingly.

Automatic calibration circuit 104 may be implemented in any suitable manner. Automatic calibration circuit 104 may include analog circuitry, digital circuitry, instructions for execution by a processor, or any suitable combination thereof. In the example of FIG. 1, automatic calibration circuit 104 may include an adjustment circuit 110 and a variable capacitor 108. Adjustment circuit 110 may include a buffer 126, a reference clock 128 or an input from reference clock 128, a frequency comparator 130, and an up/down counter 132. Adjustment circuit 110 may receive input from an output of PCB 102 through on-chip driver circuit 106 that includes a signal with the LC frequency. Adjustment circuit 110 may provide any suitable adjustment signal such as a count to variable capacitor 108, which may be configured to provide a corresponding capacitance. Variable capacitor 108 may be connected in parallel through interface 106 to $C_{PCB}$ 112, and thus augment the effective capacitance of the LC circuit of PCB 102. Buffer 126, reference clock 128, frequency comparator 130, up/down counter 132, and variable capacitor 108 may be implemented by analog circuitry, digital circuitry, instructions for execution by a processor, or any suitable combination thereof.

Buffer 126 may be configured to normalize an output signal from PCB 102 and the LC circuit therein. The output signal may be communicated through interface 106. The output signal may be normalized so that it may be compared against a reference frequency. For example, buffer 126 may convert the output signal from PCB 102 into a square wave. Buffer 126 may be implemented as, for example, a non-inverting Schmitt trigger.

A reference frequency may be provided in any suitable manner from on-chip or off-chip clock source with acceptable accuracy as per the system definition. For example, reference clock 128 may be a square wave of an expected frequency for the LC circuit. In another example, reference clock 128 may have a frequency that is a sufficient multiple of possible values of the frequency for the LC circuit such that frequency comparator 130 may accurately measure the frequency of the LC circuit. The reference frequency may be stored in, for example, a register.

The reference frequency and the frequency of LC circuit of PCB 102 may be compared by frequency comparator 130. Reference clock 128 may be used as a baseline to count a number of periods or signal transitions in the generated square wave from buffer 126. The number of periods or signal transitions in the generated square wave may be evaluated in view of an expected number of wave periods or signal transitions, given the reference clock 128 and the reference frequency.

Frequency comparator 130 may be configured to compare the frequencies of reference clock 128 and the frequency of LC circuit of PCB 102 and provide any suitable indication of which is greater. For example, frequency comparator 130 may be configured to issue a "1" or logic high output if the frequency of reference clock 128 is less than the frequency of the LC circuit of PCB 102. Frequency comparator 130 may be configured to issue a "0" or logic low output if the frequency of reference clock is greater than the frequency of the LC circuit of PCB 102. The output may be provided to up/down counter 132.

For a given output from frequency comparator 130, up/down counter 132 may be configured to add to or subtract from a running count.

The count of up/down counter 132 may be quantification of an adjustment for the capacitance of variable capacitor 108. This count may be based upon the comparison of the frequency of the LC circuit and the reference frequency. The count of up/down counter 132 may be provided to variable capacitor 108 to adjust the capacitance value thereof. The count of up/down counter 132, within a possible range of output values of up/down counter 132, may be used to set a corresponding capacitance within a possible range of capacitance values of variable capacitor 108. For example, up/down counter 132 may be a 12-bit counter, and capable of producing 4,096 different values. Variable capacitor 108 may have an input range of 4,096 different values, corresponding to 4,096 different possible capacitance values within its output range. For example, variable capacitor 108 may have a range of 0.0 to 5.0 nF. Thus, each incremental value output from up/down counter 132 provided to variable capacitor 108 may change the capacitance of variable capacitor 108 by 0.00122 nF.

The initial count of up/down counter 132 may be set to a value corresponding to an expected capacitance of variable capacitor 108 so as to cause the frequency of the LC circuit of PCB 102 to match an expected frequency. This initial count may be stored from a manufacturing or validation test, a previous use of system 100, user input, or any other suitable source.

Upon a determination that the frequency of the LC circuit of PCB 102 is less than the reference frequency, up/down counter 132 may be incremented. The increment may be of any suitable granularity, such as by a count of one. The increased count may adjust the capacitance of variable capacitor 108. The increased count may cause variable capacitor 108 to increase the capacitance of variable capacitor 108. This increased capacitance may increase the effective capacitance of the LC circuit of PCB 102. This increased capacitance may effectively adjust the on-board capacitance of $C_{PCB}$ 112. This increased effective capacitance may decrease the frequency of the LC circuit of PCB 102. Accordingly, variable capacitor 108 may be configured to adjust the effective capacitance of the LC circuit of PCB 102 based upon the quantification—the count—provided by up/down counter 132, reflecting the adjustment for the capacitance of variable capacitor 108.

Similarly, upon a determination that the frequency of the LC circuit of PCB 102 is greater than the reference frequency, up/down counter 132 may be decremented. The decrement may be of any suitable granularity, such as by a count of one. The decreased count may adjust the capacitance of variable capacitor 108. The decreased count may cause variable capacitor 108 to decrease the capacitance of variable capacitor 108. This decreased capacitance may decrease the effective capacitance of the LC circuit of PCB 102. This decreased effective capacitance may effectively adjust the on-board capacitance of $C_{PCB}$ 112. This decreased effective capacitance may increase the frequency of the LC circuit of PCB 102. Accordingly, variable capacitor 108 may be configured to adjust the effective capacitance of the LC circuit of PCB 102 based upon the quantification—the count—provided by up/down counter 132, reflecting the adjustment for the capacitance of variable capacitor 108.

The comparison of frequencies from the LC circuit of PCB 102 and the reference frequency may continue for any suitable period or under any suitable criteria. The adjustment, up or down, of the capacitance of variable capacitor 108 may reach a stasis or relatively stable state. This may be determined by, for example, whether the output of up/down counter 132 remains within a range of a few bits. In another example, the comparison of frequencies from the LC circuit of PCB 102 and the reference frequency may continue for a determined number of cycles, which would be sufficient to scan through all possible capacitance values of variable capacitor 108.

In some examples, if a difference between the frequencies from the LC circuit of PCB 102 and the reference frequency are sufficiently large, then the count output from up/down counter 132 may be made in multiples, such as by counts of two, four, or eight.

Figure 2:
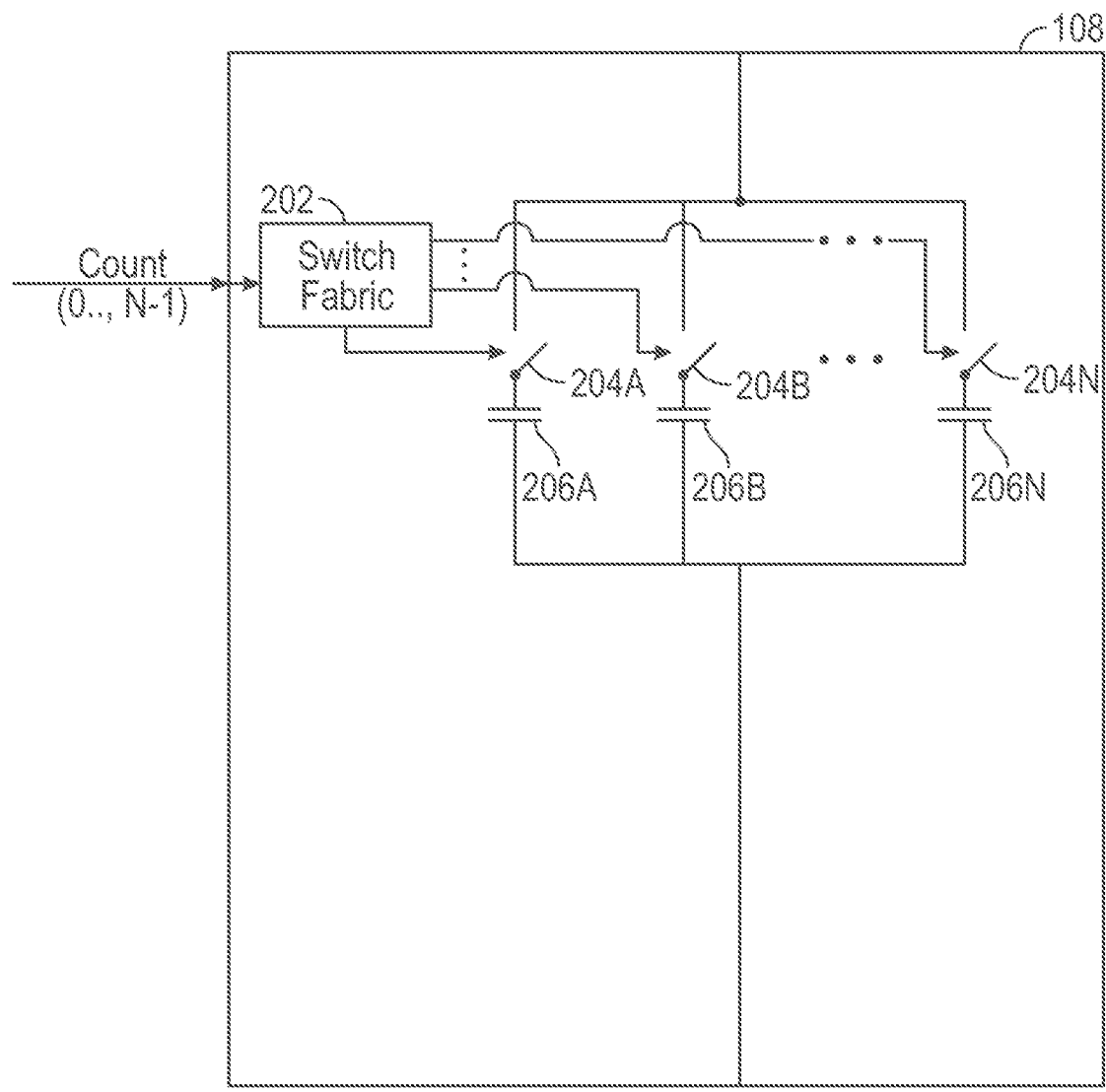
FIG. 2 is a circuit diagram of an example implementation of a variable capacitor to be used for trimming a PCB-based LC circuit.

FIG. 2 is a more detailed implementation of variable capacitor 108, according to examples of the present disclosure. Here, variable capacitor 108 is shown as implemented by an array of capacitors 206. Any suitable number of capacitors 206 may be used, such as N. Capacitors 206 may be arranged in parallel with respect to one another. The count from up/down counter 132 may be used to selectively enable branches of capacitors 206 arranged in parallel. In the example of FIG. 2, each capacitor 206 might be of a same capacitance, though any suitable combination or number of capacitors of varying sizes can be used. The count from up/down counter 132 may be represented in binary and translated by control logic or switch fabric 202 to enable or disable the different branches of capacitors 206 in parallel. For example, each branch of a capacitor 206 may be enabled or disabled with a corresponding switch 204. The total capacitance of variable capacitor 108 may be the sum of the capacitances of all the individual capacitors 206 that are enabled at a given time.

Thus, capacitors 206 might be enabled or disabled one-by-one, or in larger groups, until a stable condition is met, or a time period is expired. The capacitance applied by variable capacitor 108 to the effective capacitance of the LC circuit of PCB 102 may approximate a capacitance that in turn approximates a desired frequency of the LC circuit of PCB 102.

Figure 3:
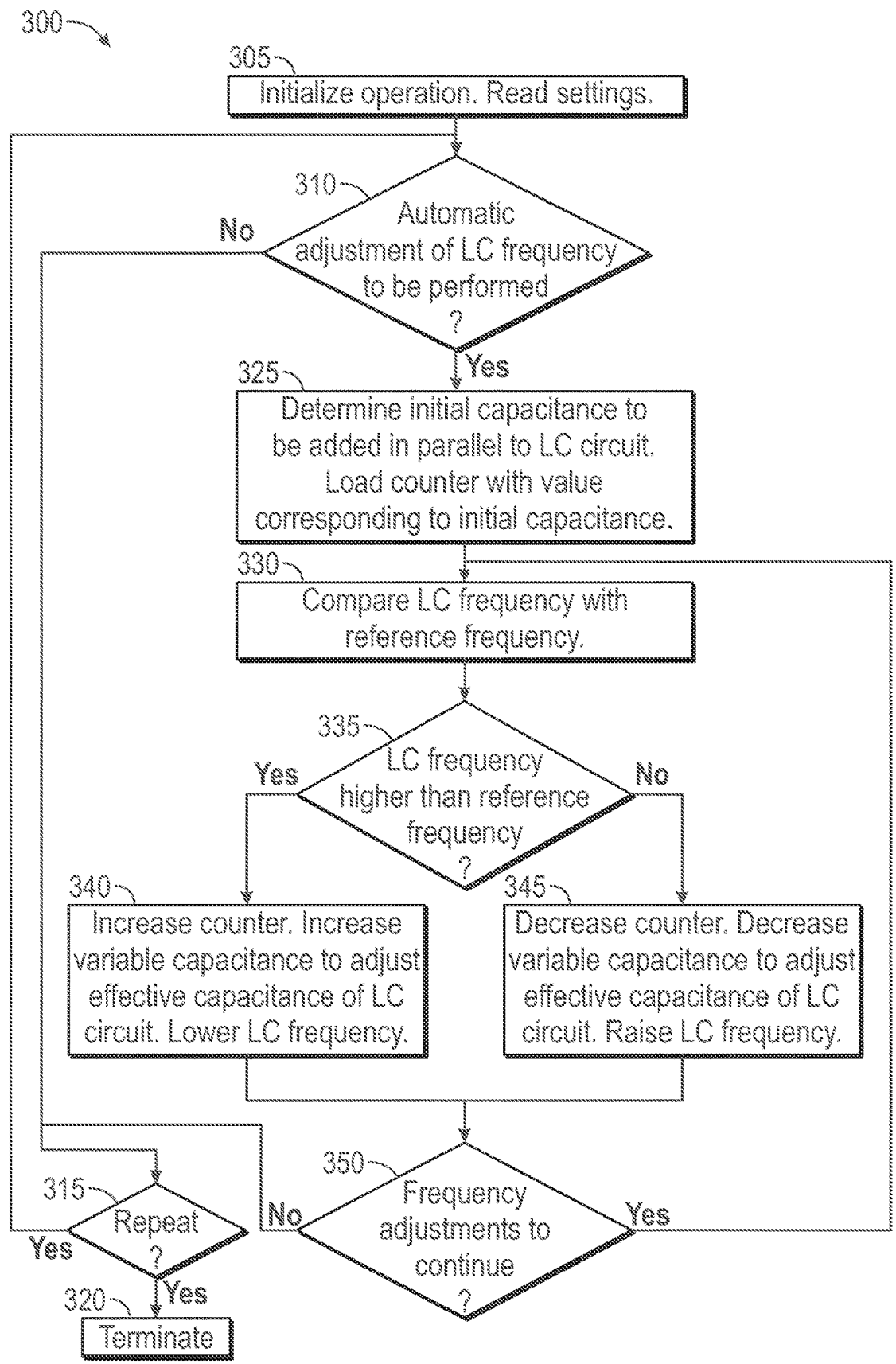
FIG. 3 is a flowchart of an example method for automatically trimming a PCB-based LC circuit.

FIG. 3 is an illustration of a method 300 for automatic trimming of a PCB-based LC circuit, according to examples of the present disclosure.

Method 300 may be implemented by any suitable system, such as the system and components illustrated in FIGS. 1-2. In particular, method 300 may be implemented by adjustment circuit 110 and variable capacitor 108. Method 300 may include more or fewer blocks than shown in FIG. 3. The blocks of method 300 may be optionally repeated, omitted, or performed in any suitable order. Multiple instances of method 300 may be performed in parallel or recursively. Moreover, various blocks of method 300 may be performed in parallel or recursively. Method 300 may begin at any suitable block, such as block 305.

At block 305, operation may be initialized. Settings may be read. The settings may include, for example, a basis on which frequencies will be evaluated, a reference frequency, or other suitable operational parameters.

At block 310, it may be determined whether automatic adjustment of the LC frequency of a PCB is to be performed. This may be determined on the basis of, for example, user demand, start-up of a system, periodically, or upon any suitable other criteria. If automatic adjustment of the LC frequency of the PCB is to be performed, method 300 may proceed to block 325. Otherwise, method 300 may proceed to block 315.

At block 315, it may be determined whether method 300 is to repeat. If so, method 300 may return to block 310. Otherwise, method 300 may terminate at block 320.

At block 325, an initial capacitance to be added in parallel to an LC circuit of the PCB may be determined. This may be based upon a last value used during operation of block 300, or a designated initial value for startup of a system for which method 300 is performed. A counter value corresponding to this initial capacitance may be determined and loaded into a counter, such as an up/down counter.

At block 330, the LC frequency from the PCB may be compared with a reference frequency. At block 335, it may be determined if the LC frequency from the PCB is higher than the reference frequency. If so, method 300 may proceed to block 340. If not, method 300 may proceed to block 345.

At block 340, the counter may be increased or incremented so as to increase a variable capacitance of a variable capacitor to be applied to the LC circuit. This may have the effect of decreasing the LC frequency of the PCB. Method 300 may proceed to block 350.

At block 345, the counter may be decreased or decremented so as to decrease the variable capacitance of the variable capacitor to be applied to the LC circuit. This may have the effect of raising the LC frequency of the PCB. Method 300 may proceed to block 350.

At block 350, it may be determined whether frequency adjustments are to continue. This may be performed on any suitable basis, such as whether a period of time for the frequency adjustments to be performed has expired, or whether a difference between the frequencies as determined in block 335 is below a threshold amount. If frequency adjustments are to continue, method 300 may return to block 330. If frequency adjustments are not to continue, method 300 may proceed to block 315.

Although examples have been described above, other variations and examples may be made from this disclosure without departing from the spirit and scope of these examples.

What is claimed is:

1. An apparatus, including:
   an interface to a printed circuit board (PCB), the PCB to include a PCB inductor and a PCB capacitor to form an LC circuit, the LC circuit to have an LC circuit frequency;
   a variable capacitor communicatively coupled to the interface and configured to adjust an effective capacitance of the LC circuit; and
   an adjustment circuit configured to adjust a capacitance of the variable capacitor to change the LC circuit frequency according to a reference frequency.

2. The apparatus of claim 1, wherein the variable capacitor is connected in parallel to the PCB capacitor through the interface.

3. The apparatus of claim 1, wherein the adjustment circuit is further configured to increase the capacitance of the variable capacitor to increase the effective capacitance of the LC circuit to decrease the LC circuit frequency.

4. The apparatus of claim 1, wherein the adjustment circuit is further configured to decrease the capacitance of the variable capacitor to decrease the effective capacitance of the LC circuit to increase the LC circuit frequency.

5. The apparatus of claim 1, wherein the adjustment circuit includes a frequency comparator circuit configured to compare the LC circuit frequency against a reference frequency, wherein the adjustment circuit is further configured to adjust the capacitance of the variable capacitor based upon the comparison of the LC circuit frequency and the reference frequency.

6. The apparatus of claim 5, wherein the adjustment circuit further includes an up/down counter configured to increase or decrease a quantification of an adjustment for the capacitance of the variable capacitor based upon the comparison of the LC circuit frequency and the reference frequency.

7. The apparatus of claim 6, wherein the variable capacitor is configured to adjust the effective capacitance of the LC circuit based upon the quantification of the up/down counter.

8. A method of trimming a capacitance of a printed circuit board (PCB), the PCB including a PCB inductor and a PCB capacitor to form an LC circuit, the LC circuit having an LC circuit frequency, comprising:
coupling a variable capacitor to, and in parallel with, a fixed capacitor wherein the variable capacitor is incorporated into an integrated circuit mounted to a PCB and the fixed capacitor is mounted to the PCB as part of an LC circuit,
comparing an LC circuit frequency of the LC circuit with a reference frequency,
increasing a capacitance of a variable capacitor if the LC circuit frequency is higher than the reference frequency, and
decreasing the capacitance of the variable capacitor if the LC circuit frequency is lower than the reference frequency.

9. The method of claim 8, further comprising:
incrementing a counter if the LC circuit frequency is higher than the reference frequency,
decrementing the counter if the LC circuit frequency is lower than the reference frequency, and
setting the capacitance of the variable capacitor based on the value of the counter.

10. The method of claim 8, further comprising:
terminating the method after both increasing and decreasing the capacitance.

11. The method of claim 8, further comprising:
terminating the method after a predetermined amount of time has elapsed.

12. The method of claim 9, further comprising:
determining an initial capacitance of the variable capacitor,
loading the counter with a value corresponding to the initial capacitance, and
setting the capacitance of the variable capacitor based on the value of the counter.

13. The method of claim 9, wherein the variable capacitor comprises two terminals and a plurality of capacitor units, each capacitor unit selectively coupled to the terminals, wherein setting the capacitance of the variable capacitor further comprises selectively coupling a number of capacitor units equal to the value of the counter.

14. A microcontroller configured to trim a capacitance of a printed circuit board (PCB), the PCB including a PCB inductor and a PCB capacitor to form an LC circuit, the LC circuit having an LC circuit frequency, the microcontroller comprising:
a variable capacitor coupled to, and in parallel with, a fixed capacitor wherein the variable capacitor is incorporated into a microcontroller mounted to a PCB and the fixed capacitor is mounted to the PCB as part of an LC circuit,
the microcontroller programmed to:
compare an LC circuit frequency of the LC circuit with a reference frequency,
increase a capacitance of a variable capacitor if the LC circuit frequency is higher than the reference frequency, and
decrease the capacitance of the variable capacitor if the LC circuit frequency is lower than the reference frequency.

15. The microcontroller of claim 14, the microcontroller further programmed to:
increment a counter if the LC circuit frequency is higher than the reference frequency,
decrement the counter if the LC circuit frequency is lower than the reference frequency, and
set the capacitance of the variable capacitor based on the value of the counter.

16. The microcontroller of claim 14, the microcontroller further programmed to:
terminate the method after both increasing and decreasing the capacitance.

17. The microcontroller of claim 14, the microcontroller further programmed to:
terminate the method after a predetermined amount of time has elapsed.

18. The microcontroller of claim 15, the microcontroller further programmed to:
determine an initial capacitance of the variable capacitor,
load the counter with a value corresponding to the initial capacitance, and
set the capacitance of the variable capacitor based on the value of the counter.

19. The microcontroller of claim 15, wherein the variable capacitor comprises two terminals and a plurality of capacitor units, each capacitor unit selectively coupled to the terminals, wherein the microcontroller is further programmed to selectively couple a number of capacitor units equal to the value of the counter.

* * * * *